(12) United States Patent
Fournel

(10) Patent No.: US 6,580,370 B2
(45) Date of Patent: Jun. 17, 2003

(54) INTEGRATED CIRCUIT WITH PROTECTION DEVICE

(75) Inventor: Richard Fournel, Lumbin (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/895,839

(22) Filed: Jun. 29, 2001

(65) Prior Publication Data

US 2002/0024070 A1 Feb. 28, 2002

(30) Foreign Application Priority Data

Jun. 30, 2000 (FR) .............................................. 0008546

(51) Int. Cl.[7] .............................................. G08B 17/10
(52) U.S. Cl. ..................... 340/635; 340/644; 340/652; 340/653; 340/660; 340/5.6; 235/380; 235/382
(58) Field of Search ................................ 340/635, 638, 340/644, 649, 650, 652, 653, 657, 660, 662, 664, 5.6; 235/380, 382, 382.5, 492, 493, 494; 705/41

(56) References Cited

U.S. PATENT DOCUMENTS

| 4,105,156 A | * | 8/1978 | Dethloff | ..................... 235/441 |
|---|---|---|---|---|
| 5,508,548 A | * | 4/1996 | Tailliet | ........................ 257/360 |
| 5,763,869 A | * | 6/1998 | Moll et al. | .................... 235/487 |
| 5,796,083 A | * | 8/1998 | Kenneth et al. | ............. 255/380 |
| 5,890,191 A | * | 3/1999 | Espinor et al. | .............. 711/103 |
| 6,040,708 A | | 3/2000 | Blake et al. | ................... 326/33 |
| 6,264,108 B1 | * | 7/2001 | Baintsch | ..................... 235/487 |

FOREIGN PATENT DOCUMENTS

| EP | 0432049 | 6/1991 | ........... G11C/16/06 |
|---|---|---|---|
| FR | 2647929 | 12/1990 | ........... G08B/13/22 |

* cited by examiner

Primary Examiner—Toan Pham
(74) Attorney, Agent, or Firm—Lisa K. Jorgenson; Allen, Dyer, Doppelt, Milbrath & Gilchrist, P.A.

(57) ABSTRACT

An integrated circuit receives as supply voltages a ground reference voltage, a logic supply voltage and a high voltage. A protection device is associated with at least one gate oxide circuit element. The protection device applies to a supply node of the circuit element either the logic supply voltage under normal conditions of operation of the integrated circuit, or the high voltage under abnormal conditions of operation of the integrated circuit for breaking down the gate oxide.

33 Claims, 2 Drawing Sheets

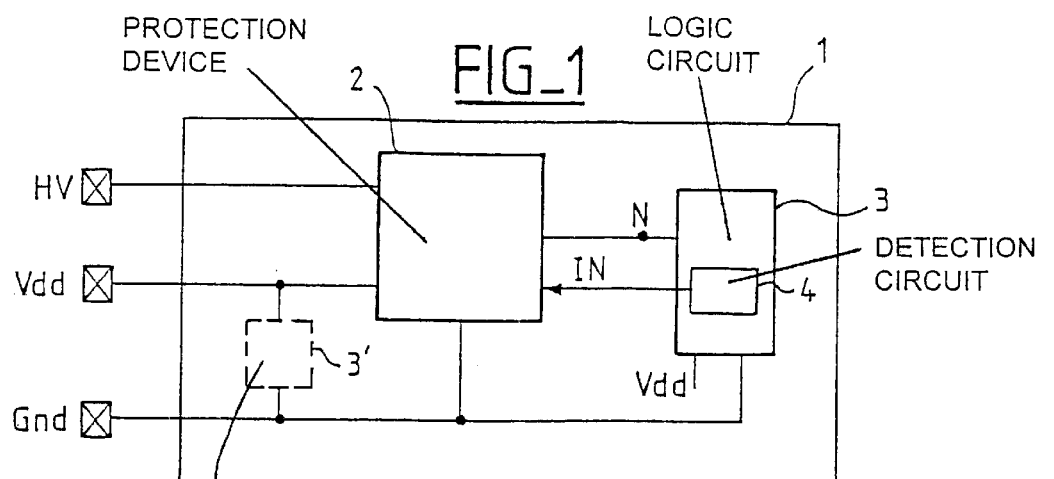
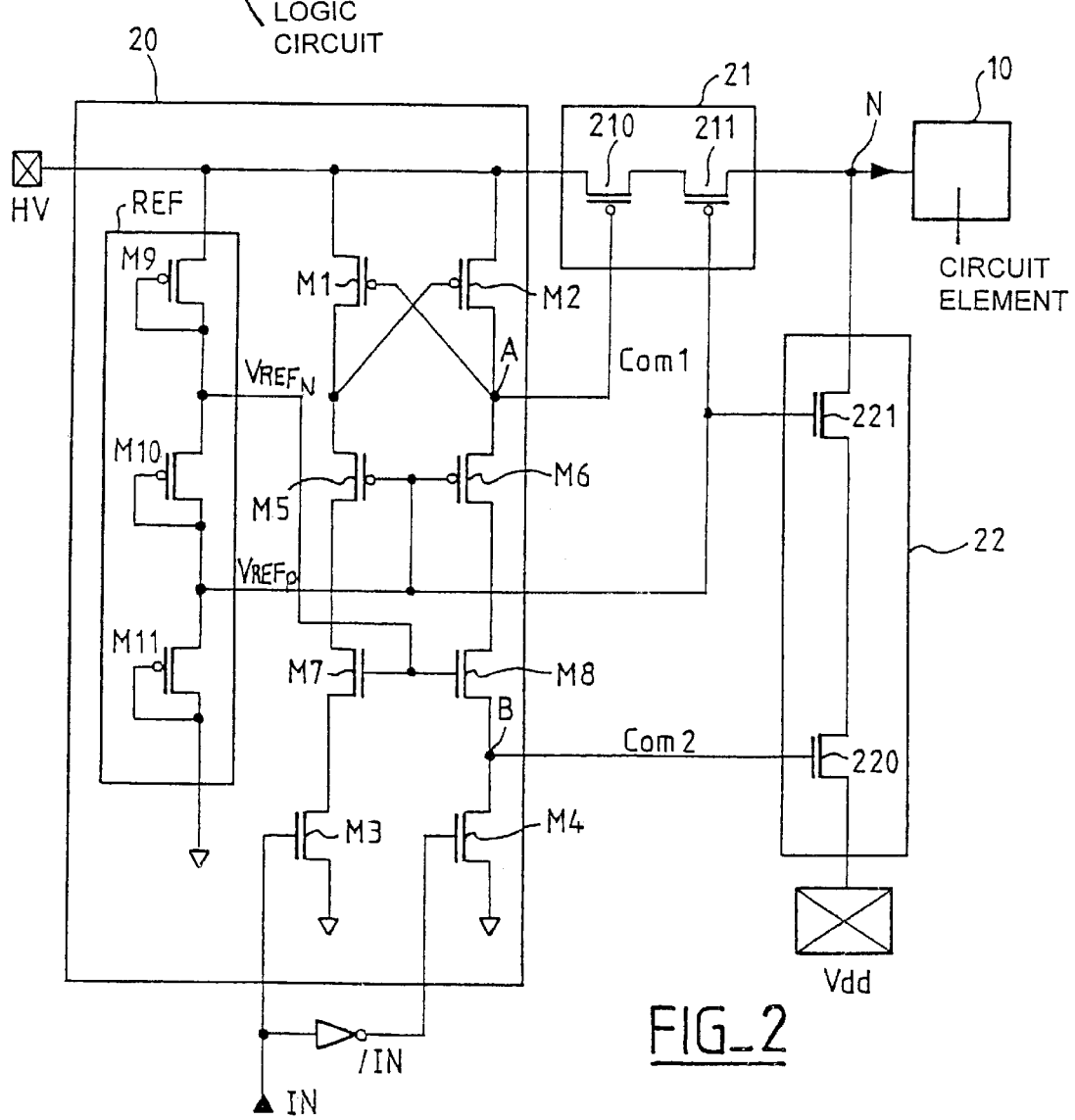

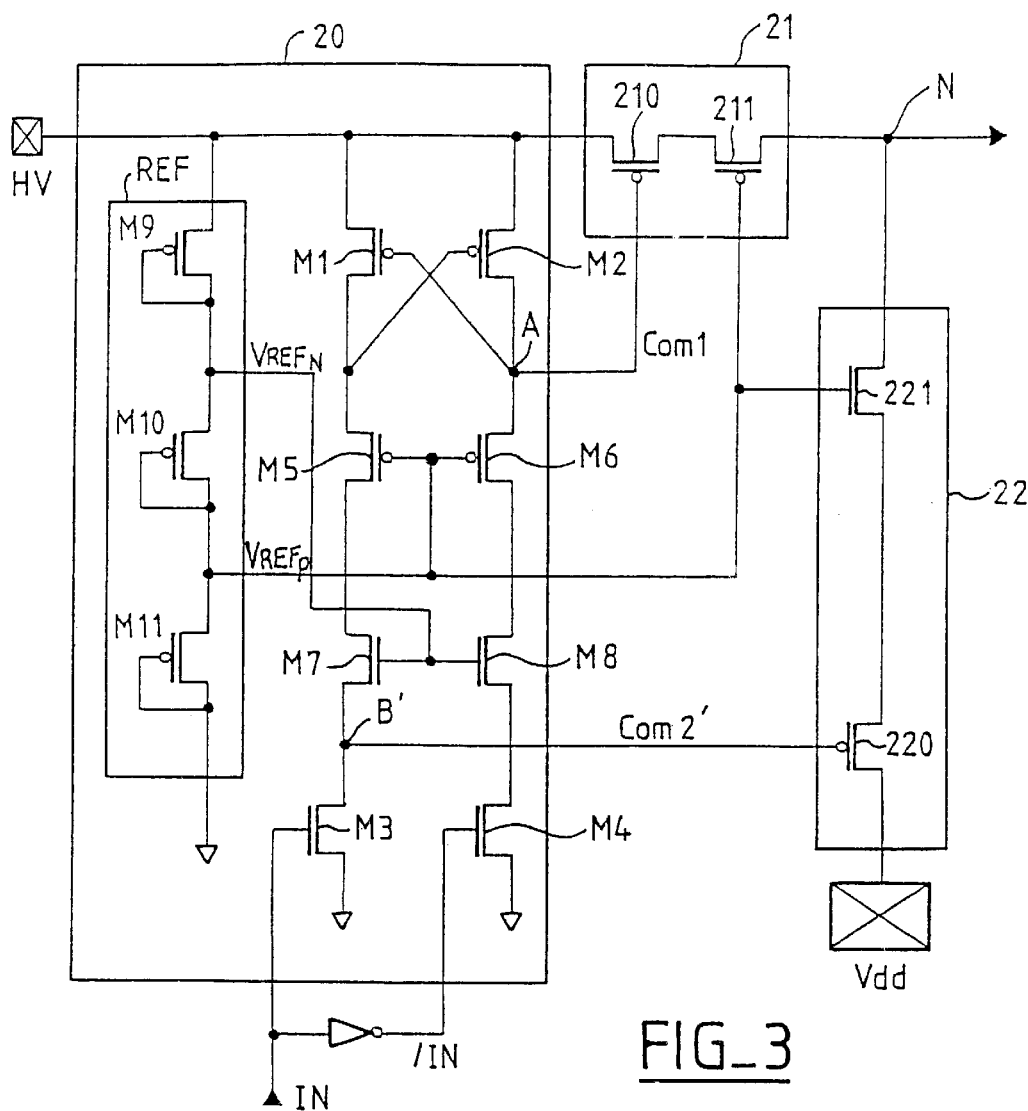
FIG_3
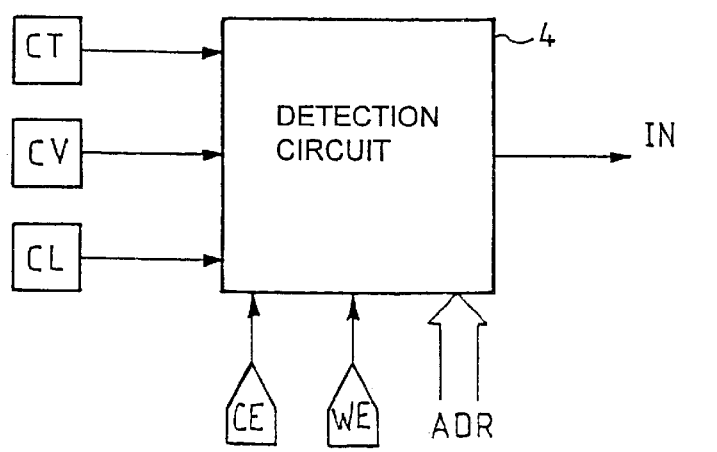
FIG_4

INTEGRATED CIRCUIT WITH PROTECTION DEVICE

FIELD OF THE INVENTION

The present invention relates to the field of integrated circuits, and more particularly, to an integrated circuit comprising a protection device.

BACKGROUND OF THE INVENTION

Many applications use data elements that have to be kept secret. This is the case especially with smart cards or data encoding/data encryption circuits which contain confidential codes, encryption keys, etc. These secret data elements are generally contained in programmable non-volatile memories, for example EEPROMs, EPROMs or flash EPROM type memories. For these applications, it is vital to prevent access to these data elements in all circumstances.

The possibilities for unwanted access are numerous. In particular, there is a prediction method using statistical analysis based on the consumption of current by the circuit. This method can be used for the bit-by-bit reconstruction of at least certain confidential data elements. There are also more direct methods, such as optical inspection after the deactivation of the integrated circuit, and modification of operating conditions, such as for example, temperature, supply voltages, etc.

Thus, integrated circuits containing secret data elements of this kind generally comprise a wide range of sensors associated with a device for protecting the operating conditions of the integrated circuit, and to generate an alarm signal once an anomaly is detected. An anomaly may be an abnormal variation in the ambient temperature, the luminosity, (the depassivation of the integrated circuit), an abnormal level of a supply voltage, several abortive read or write attempts, etc. This list is not exhaustive.

When an alarm signal is generated, this signal is generally used to interrupt the operation in progress and reinitialize the integrated circuit. Furthermore, means have long been known, such as encoding mask circuits, access protection circuits and secured software procedures for protecting access to the secret data elements.

SUMMARY OF THE INVENTION

In view of the foregoing background, it is an object of the present invention to improve the protection of secret data elements in an integrated circuit that receives, at external power supply pins, a ground reference voltage, a logic supply voltage and a high voltage normally used for the programming of the non-volatile memory elements.

This and other objects, advantages and features of the present invention are provided by using the available high voltage to destroy all or part of the logic circuitry of the integrated circuit so that it becomes unusable. The thoroughness with which the integrated circuit is destroyed makes it impossible to know the contents of the integrated circuit, and the secret data elements cannot be known.

In recent submicron MOS technologies, the gate oxides have a thickness of about 32 angstroms to 0.8 microns. They can therefore withstand no more than 1.8 volts at their terminals. The sudden application of high voltage to these oxides causes the irreparable destruction of the gate oxides. It is this characteristic that is used in the present invention.

Thus, according to the present invention, the activation of the alarm signal causes the application of the high voltage, instead of the logic supply voltage, to the elements of the logic circuitry. The gate oxides of these elements are then irreparably destroyed. In practice, these logic elements are chosen so that their destruction makes the integrated circuit unusable. The destruction may be the entire integrated circuit or only a part thereof, such as the microprocessor, the address selection logic, the data input/output registers, etc.

A power supply control device according to the present invention has two voltage selector switches, one to switch over the high voltage and the other to switch over the logic supply voltage to a power supply input node of at least one logic element of the integrated circuit.

These selection switches are controlled in a complementary manner by a voltage level translator connected between the high voltage and ground. This translator is controlled by a binary control signal generated internally by the integrated circuit. As long as the alarm signal is not activated, it is the logic supply voltage that is applied as a supply voltage for these logic elements. As soon as the alarm signal is activated, it is the high voltage that is switched over to the power supply input node of these logic elements, causing their irreparable destruction by the breakdown of the gate oxides.

As characterized, the present invention therefore pertains to an integrated circuit having, as power supply voltages, at least one logic supply voltage and one high voltage. According to the invention, the integrated circuit furthermore comprises a protection device associated with at least one gate oxide circuit element for the application, to a supply node of the element, of either the logic supply voltage under normal conditions of operation of the integrated circuit or the high voltage under abnormal conditions of operation of the integrated circuit for breaking down the gate oxide.

BRIEF DESCRIPTION OF THE DRAWINGS

Other features and advantages of the present invention are described in detail in the following description, given by way of a non-restrictive indication of the invention, with reference to the appended drawings of which:

FIG. 1 is a block diagram of an integrated circuit using submicron technologies comprising a protection device according to the present invention;

FIGS. 2 and 3 each show a detailed diagram of an embodiment of a protection device according to the present invention; and FIG. 4 is a block diagram of the detection means for detecting abnormal conditions of operation according to the present invention.

DETAILED DESCRIPTION OF THE PREFERRED EMBODIMENTS

FIG. 1 is a block diagram of an integrated circuit 1 based on submicron technology. The power supply for the logic circuitry of this circuit 1 is controlled by a protection device according to the present invention. The supply input node of this circuitry is N, and normally receives the logic supply voltage Vdd. Through the protection device 2 according to the present invention, this node is taken to the high voltage in the case of a detection of abnormal conditions of operation of the integrated circuit. More specifically, the integrated circuit 1 receives a ground Gnd and a logic supply voltage Vdd at external pins. A high voltage HV may be either given internally by a charge pump for example, or received at an external pin as shown in the figure.

The voltages Gnd and Vdd are usually applied directly to the logic circuitry 3 of the integrated circuit 1. The high voltage HV is used to enable the programming of non-volatile memory elements of the EEPROM type for example, that are not shown. In the case of the low-voltage integrated circuits that are of special interest here, for which the high voltage is 5 volts, this high voltage is also used to obtain interfaces with integrated circuits using 5-volt technologies.

The logic circuitry 3 of the integrated circuit 1 may comprise for example a microprocessor and ROM, RAM memory, and furthermore comprises means 4 for the detection of abnormal conditions of operation of the integrated circuit 1. The detection means 4 are especially associated with different sensors or software detectors. At the output, these detection means 4 give an alarm signal referenced IN in FIG. 1. In the example shown in FIG. 1, this signal is directly applied to the protection device 2. It will be noted in practice that it is generally the microprocessor that activates this alarm signal after verification of the sensors and analysis of the data elements received from these sensors or software detectors, as a function of the different criteria of security. These techniques are widely known and have been used for a long time, especially in integrated circuits designed for smart-card applications.

It will be noted that, in practice, it is not necessary to destroy the entire logic circuitry 3. It is thus possible to plan that a part of the logic circuitry will not be effected, and will always receive the logic supply voltage Vdd. It is sufficient that the supply node N controlled by the protection device according to the invention should be used to power at least one logic element that is vital for the integrated circuit 1, in such a way that its destruction makes the integrated circuit absolutely unusable. Thus, in this figure, dashes are used to show a part 3' of the logic circuitry directly supplied by the logic supply voltage received at the corresponding pin of the integrated circuit 1. The detection means 4 may be applied without distinction in the part 3 or the part 3' of the logic circuitry.

This type of breakdown distributed in many zones of the integrated circuit 1 makes it impossible to repair the integrated circuit. This would not be the case if the operation were to be limited, for example, to breaking down fuses.

An exemplary embodiment of a protection device according to the present invention is shown in FIG. 2. In this example, the protection device 2 according to the present invention has two selection switches 21 and 22. A first selection switch 21 is connected between the high voltage HV and the supply node N of at least one element 10 of the logic circuitry. A second selection switch 22 is connected between the logic supply voltage Vdd and the supply node N. The two selection switches 21 and 22 are controlled by means 20 in a complementary way so that only one of them is closed at a given point in time to apply the associated voltage to the supply node N.

The means 20 are, in practice, a level translator capable of providing the switching signals for the selection switches 21 and 22 at the output. This translator 20 is controlled by the binary control signal IN. It is powered between the high voltage HV and ground Gnd. Since it has to permanently withstand the high-voltage HV, this translator 20 may comprise a protection stage with at least one cascode stage. Alternatively, it may comprise elements capable of withstanding the high voltage, such as for example, MOS transistors with drain extensions, or "drift" type transistors or MOS transistors with thick oxides, for example an oxide with a thickness of 120 angstroms. This protection stage is used to limit the internal nodes of the translator 20 to intermediate voltage levels, so that no transistor of the translator perceives an excessively high voltage at its terminals. The transistors of this protection stage are designated as cascode transistors.

Thus, in the example shown, the translator 20 has two arms. In each arm, it has four series-connected transistors between the high voltage HV and ground. Each arm includes one load transistor connected to the high voltage, one selection switch transistor connected to ground and controlled by the binary control signal (or its inverse), and two cascode transistors. One of the cascode transistors is to protect the load transistor and the other is to protect the selection switch transistor. The translator 20 furthermore has a circuit REF for the generation of reference voltages $V_{REF_N}$ and $V_{REF_P}$ for the cascode transistors.

In one exemplary embodiment based on CMOS technology and corresponding to the drawing of FIG. 2, the selection switch transistors of the translator 20 are N-type transistors. They have their sources connected to ground. The load transistors are P-type transistors. Each of them has its source connected to the high voltage HV and its gate connected to the drain of the load transistor of the other arm.

The first arm thus has, in series between the high voltage and ground a P-type load transistor M1, a P-type cascode transistor M5, an N-type cascode transistor M7 and an N-type selection switch transistor M3. Similarly, the other arm includes a P-type load transistor M2, a P-type cascode transistor M6, an N-type cascode transistor M8 and an N-type selection switch transistor M4.

The circuit REF associated with the cascode transistors is used to generate reference voltages $V_{REF_N}$ and $V_{REF_P}$ to control the gates of the cascode transistors which are N-type and P-type transistors respectively. In the exemplary embodiment shown in FIG. 2, this circuit REF is a resistive divider comprising three MOS transistors M9, M10, M11 series-connected between the high voltage HV and ground. These three transistors work as resistors since each of them has its gate connected to its drain. In the example, they are P-type transistors. The reference voltages $V_{REF_n}$ and $V_{REF_p}$ are obtained by taking the voltage on either side of the middle transistor M10.

With these reference voltages, each cascode transistor limits the voltage excursions at its terminals. Thus, the source of each P-type cascode transistor cannot fall below $V_{REF_P}+Vt_p$, where $Vt_p$ is the threshold voltage of the P-type cascode transistor. Similarly, the source of each N-type cascode transistor cannot rise above $V_{REF_n}-Vt_n$, where $Vt_n$ is the threshold voltage of the N-type cascode transistor.

The translator 20 must give the necessary selection switching signals to achieve a complementary switching of the selection switches 21 and 22. For this purpose, these selection switching signals must have their high and low levels such that the voltage to be switched over is done so without loss and such that the selector switch in the open state has no current leakages.

A first selection switching signal Com1 is obtained in one arm of the translator, between the load transistor connected to the high voltage and the following cascode transistor namely, in the example, between the transistors M2 and M6. The level of this selection switch signal Com 1 is either that of the high voltage HV, or a low level ($V_{REF_P}+Vt_p$) dictated by the cascode transistor M6 and depending on the cascode reference voltage $V_{REF_p}$.

A second selection switching signal Com2 is obtained in one arm of the translator, between the selection switch transistor connected to ground Gnd and the previous cascode transistor, namely in the example between the transistors M4 and M8. The level of this selection switching signal com2 is either that of ground or a higher level $V_{REF_n}+Vt_n$ that must be greater than $Vdd+Vt_n$. These two selection switching signals Com1 and Com2 are used to achieve a complementary control of the two selection switches 21 and 22.

In the example, the selection switch 21 has two P-type MOS transistors M210 and M211, series-connected between the high voltage HV and the supply node N. The transistor M210 receives the first selection switching signal Com1 at its gate. It is this signal that is used to switch over the high voltage HV to the supply node N, while the second transistor M211 acts as a cascode transistor and protects the transistor M210. Similarly, the selection switch 22 has two P-type MOS transistors M220 and M221 series-connected between the logic supply voltage and the supply node N. The transistor M220 receives the second selection switching signal Com2 at its gate. It is this transistor that is used to switch the supply voltage Vdd to the supply node N, while the second transistor 221 acts as a cascode transistor and protects the transistor M220.

It will be noted that the presence of the cascode transistors in the selection switches depends on the difference in level between the high voltage HV and the logic supply voltage Vdd. Should the high voltage HV be equal to 5 V and the logic supply voltage Vdd be equal to 1.8 V (corresponding to an oxide thickness of 35 angstroms), the difference between these two voltages is 3.2 V, namely a level that cannot be withstood by the gate oxide of a transistor such as the transistor 210 in the technology considered.

However, if a submicron technology with an oxide thickness of 55 to 70 angstroms is considered, the logic supply voltage Vdd is higher, in the range of 3.3 V. In this case, the voltage difference is smaller than the logic supply voltage, and the cascode transistors are no longer necessary in the selection switches. This is also true if the selection switch transistors are of the type with a thicker oxide (120 angstroms). In this case, the voltage Vdd selection switch transistor can be directly controlled by the output Com1.

The cascode transistors of the selection switches receive a gate voltage that is a reference voltage of the cascode transistors of the translator, so that they are on in all circumstances. In the example, the cascode transistors 211 (P MOS) and 221 (N MOS) receive the reference voltage $V_{REF_P}$ at their gate.

Thus, when the supply voltage Vdd is switched over to the node N, no element of the selection switch 21 perceives an excessively high voltage at its terminals. Conversely, when the high voltage HV is switched over to the node N, no element of the selection switch 22 perceives an excessively high voltage at its terminals.

In the exemplary embodiment shown in FIG. 2, the transistor 220 of the selection switch 22 is an N-type transistor. In one variation shown in FIG. 3, it is a P-type transistor. The second selection switch signal is then taken in the other arm, between the transistor M3 connected to ground and the preceding cascode transistor M7 in the example. This selection switch transistor is referenced Com2' in FIG. 3.

Referring to the embodiment shown in FIG. 2, when the alarm signal IN is at its active level, corresponding in the example to the low state 0, the first selection switch signal Com1 gets set at the lower limit dictated by the cascode transistor M6, namely the $V_{REF_P}+Vt$. This turns the selection switch transistor 210 on. The second selection switching signal Com2 is drawn to ground by the transistor M4, which is on. The selection switch transistor 220 is off. The high voltage HV is switched over to the node N.

When the alarm signal IN is at its inactive level, corresponding in the example to the high state 1, it is the transistor M3 that comes on. The first selection switch signal Com1 rises and gets established at HV (5 V). The selection switch transistor M210 is therefore completely off. The second selection switch signal rises to a high level of about $V_{REF_N}-Vt_n$, a limit that is dictated by the cascode transistor M8 which must be greater than $Vdd+Vt_n$. In practice, a gate voltage slightly above its source voltage (Vdd) is enough to turn the transistor M220 on. Thus, the logic supply voltage Vdd is switched over to the node N.

In both cases, with IN at a 1 and IN at a 0, the voltage levels applied to the terminals (drain, source, gate) of the transistors of the selection switches 21 and 22 are such that these transistors are never under stress and have no current leakages. This ensures the reliability of the protection device according to the invention.

In practice, the values of the low level of the first selection switch signal and of the high level of the second selection switch signal are obtained by appropriately sizing the transistors of the reference circuit of the cascode transistors. In the example, with HV at 5 volts and Vdd at 1.8 volts, it is necessary to size the reference circuit so that $V_{REF_P}+Vt$ is smaller than $Vdd-(Vt_P+Vbe)$ where Vbe represents the substrate effect, namely in practice below about 4 volts, and $V_{REF_N}-Vt$ is greater than $Vdd+Vt_n$, namely about 2.3 volts (for Vdd=1.8 volts).

FIG. 4 gives a diagrammatic view of the anomaly detection means 4, which generates the alarm signal IN at its output. In the example, the detection means 4 receives control signals for the integrated circuit, such as typically the selection signal CE and write signal WE and the address signals ADR, and the output of sensors and software detectors. For the sensors, it is possible to have a temperature sensor CT, a voltage sensor CV that verifies the level of the logic supply voltage Vdd, a light sensor CL, etc. The software detectors could comprise a detector of anomalies at the access points, in the use of the set of instructions, etc.

In practice, all or part of the verifications of the sensors and detectors may be carried out by a microprocessor, i.e., a microprocessor of the integrated circuit 1, to generate an alarm signal on the basis of defined criteria.

The present invention is not limited to the special exemplary implementations or embodiments described herein. In particular, there are many practical variations of translators that can be applied to the protection device 2 according to the present invention. The selection of the logic elements that will be supplied by a protection device 2 according to the invention depends in practice on the integrated circuit considered and its application.

That which is claimed is:

1. An integrated circuit having as power supply voltages a low voltage reference, a logic supply voltage reference and a high voltage reference, with the high voltage reference being greater than the low voltage reference and the logic supply voltage reference, the integrated circuit comprising:

at least one circuit element comprising a gate oxide and a supply node; and a protection device connected to said at least one circuit element for applying to the supply node the logic supply voltage reference under normal operating conditions of the integrated circuit, and for applying the high voltage reference under abnormal operating conditions of the integrated circuit for breaking down the gate oxide of said at least one circuit element.

2. An integrated circuit according to claim 1, wherein breaking down the gate oxide of said at least one circuit element disables the integrated circuit.

3. An integrated circuit according to claim 1, wherein said at least one circuit element is at least part of a logic circuit.

4. An integrated circuit according to claim 1, further comprising detection means for generating an alarm signal to be applied to said protection device when the abnormal operating conditions of the integrated circuit are detected.

5. An integrated circuit according to claim 4, wherein said protection device comprises:
    a first selection switch for applying the high voltage reference to the supply node of said at least one circuit element; and
    a second selection switch for applying the logic supply voltage reference to the supply node of said at least one circuit element;
    said first and second selection switches operating in a complementary manner.

6. An integrated circuit according to claim 5, wherein said protection device comprises a voltage translator comprising at least one cascode stage, said voltage translator connected between the low and high voltage references and being controlled responsive to the alarm signal for generating at least one control signal for switching between said first and second selection switches.

7. An integrated circuit according to claim 6, wherein said at least one cascode stage comprises first and second arms, with each arm comprising:
    a first transistor connected to the high voltage reference;
    a second transistor connected to the low voltage reference voltage; and
    at least one cascode transistor connected between said first and second transistors;
    the at least one control signal including a first selection switch control signal and a second selection switch control signal.

8. An integrated circuit according to claim 7, wherein the first selection switch control signal is taken from the first arm between said first transistor and said at least one cascode transistor, and the second selection switch control signal is taken from the second arm between said second transistor and said at least one cascode transistor.

9. An integrated circuit according to claim 7, wherein the first selection switch control signal is taken from the first arm between said first transistor and said at least one cascode transistor, and the second selection switch control signal is taken from the first arm between said second transistor and said at least one cascode transistor.

10. An integrated circuit according to claim 7, wherein said first and second selection switches each comprises:
    a cascode transistor connected between the supply node of said at least one circuit element, said cascode transistor comprising a control terminal for receiving a respective reference voltage from said voltage translator; and
    a selection transistor connected to said cascode transistor for receiving the respective first or second selection switch control signal provided by said voltage translator.

11. An integrated circuit according to claim 1, wherein the logic supply voltage for the entire integrated circuit is applied to the supply node of said at least one circuit element.

12. An integrated circuit according to claim 1, further comprising at least one external pin, and wherein the high voltage reference is externally generated for application to said at least one external pin.

13. An integrated circuit according to claim 1, wherein the high voltage reference is internally generated from the logic supply voltage reference.

14. An integrated circuit comprising:
    a plurality of input terminals for respectively receiving power supply voltages including a low voltage reference, a logic supply voltage reference and a high voltage reference, with the high voltage reference being greater than the low voltage reference and the logic supply voltage reference;
    a logic circuit comprising at least one circuit element comprising a gate oxide;
    a detection circuit connected to said logic circuit for detecting abnormal operating conditions of the integrated circuit; and
    a protection device connected to said detection circuit, and to said at least one circuit element for applying the logic supply voltage reference thereto under normal operating conditions of the integrated circuit, and for applying the high voltage reference thereto under abnormal operating conditions of the integrated circuit for breaking down the gate oxide of said at least one circuit element.

15. An integrated circuit according to claim 14, wherein breaking down the gate oxide of said at least one circuit element disables the integrated circuit.

16. An integrated circuit according to claim 14, wherein said protection device comprises:
    a first selection switch for applying the high voltage reference to the supply node of said at least one circuit element; and
    a second selection switch for applying the logic supply voltage reference to the supply node of said at least one circuit element;
    said first and second selection switches operating in a complementary manner.

17. An integrated circuit according to claim 16, wherein said protection device comprises a voltage translator comprising at least one cascode stage, said voltage translator connected between the low and high voltage references and being controlled responsive to the alarm signal for generating at least one control signal for switching between said first and second selection switches.

18. An integrated circuit according to claim 17, wherein said at least one cascode stage comprises first and second arms, with each arm comprising:
    a first transistor connected to the high voltage reference;
    a second transistor connected to the low voltage reference voltage; and
    at least one cascode transistor connected between said first and second transistors;
    the at least one control signal including a first selection switch control signal and a second selection switch control signal.

19. An integrated circuit according to claim 18, wherein the first selection switch control signal is taken from the first arm between said first transistor and said at least one cascode transistor, and the second selection switch control signal is taken from the second arm between said second transistor and said at least one cascode transistor.

20. An integrated circuit according to claim 18, wherein the first selection switch control signal is taken from the first arm between said first transistor and said at least one cascode transistor, and the second selection switch control signal is taken from the first arm between said second transistor and said at least one cascode transistor.

21. An integrated circuit according to claim 18, wherein said first and second selection switches each comprises:
- a cascode transistor connected between the supply node of said at least one circuit element, said cascode transistor comprising a control terminal for receiving a respective reference voltage from said voltage translator; and
- a selection transistor connected to said cascode transistor for receiving the respective first or second selection switch control signal provided by said voltage translator.

22. An integrated circuit according to claim 14, wherein the logic supply voltage for the entire integrated circuit is applied to a supply node of said at least one circuit element.

23. A method for protecting an integrated circuit against abnormal operating conditions, the integrated circuit comprising at least one circuit element comprising a gate oxide, and a protection device connected to a supply node of the at least one circuit element, the method comprising:
- detecting the abnormal operating conditions of the integrated circuit; and
- applying a high voltage reference instead of a logic voltage reference to the supply node of the at least one circuit element for breaking down the gate oxide based upon detection of the abnormal operating conditions, the high voltage reference being provided by the protection device and being greater than the logic supply voltage reference.

24. A method according to claim 23, wherein breaking down the gate oxide of the at least one circuit element disables the integrated circuit.

25. A method according to claim 23, wherein the integrated circuit comprises a logic circuit, and wherein the at least one circuit element is part of the logic circuit.

26. A method according to claim 23, further comprising applying the logic voltage reference to the supply node of the at least one circuit element under normal operating conditions of the integrated circuit.

27. A method according to claim 23, further comprising generating and applying an alarm signal to a control input of the protection device when the abnormal operating conditions of the integrated circuit are detected.

28. A method according to claim 27, wherein the protection device comprises a first selection switch and a second selection switch, the method comprising:
- applying the high voltage reference to the supply node of the at least one circuit element using the first selection switch; and
- applying the logic supply voltage reference to the supply node of said at least one circuit element using the second selection switch;
- the first and second selection switches operating in a complementary manner.

29. A method according to claim 28, wherein the protection device comprises a voltage translator comprising at least one cascode stage, the voltage translator is connected between a low voltage reference and the high voltage reference and is controlled responsive to the alarm signal for generating at least one control signal for switching between the first and second selection switches.

30. A method according to claim 29, wherein the at least one cascode stage comprises first and second arms, with each arm comprising:
- a first transistor connected to the high voltage reference;
- a second transistor connected to the low voltage reference voltage; and
- at least one cascode transistor connected between the first and second transistors;
- wherein the at least one control signal includes a first selection switch control signal and a second selection switch control signal.

31. A method according to claim 23, wherein the logic supply voltage for the entire integrated circuit is applied to the supply node of the at least one circuit element.

32. A method according to claim 23, wherein the integrated circuit comprises at least one external pin, and wherein the high voltage reference is externally generated for application to the at least one external pin.

33. A method according to claim 23, wherein the high voltage reference is internally generated from the logic supply voltage reference.

* * * * *